(12) United States Patent
Hung et al.

(10) Patent No.: US 7,705,428 B2
(45) Date of Patent: Apr. 27, 2010

(54) VARACTOR

(75) Inventors: Cheng-Chou Hung, Jhubei (TW); Hua-Chou Tseng, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/386,363

(22) Filed: Mar. 21, 2006

(65) Prior Publication Data

US 2007/0246801 A1    Oct. 25, 2007

(51) Int. Cl.
    *H01L 29/93*    (2006.01)
(52) U.S. Cl. .............................. 257/600; 257/E27.049
(58) Field of Classification Search .......... 257/E27.049, 257/E29.344, E21.364, 312, 595, 600, 598; 332/136; 361/277; 438/379
    See application file for complete search history.

(56) References Cited

U.S. PATENT DOCUMENTS

| | | | | |
|---|---|---|---|---|
| 4,427,457 A | * | 1/1984 | Carlson et al. ............... | 438/395 |
| 5,635,742 A | * | 6/1997 | Hoshi et al. .................. | 257/337 |
| 6,121,657 A | * | 9/2000 | Yama ........................... | 257/341 |
| 6,228,734 B1 | * | 5/2001 | Bliss et al. ................... | 438/379 |
| 6,521,939 B1 | * | 2/2003 | Yeo et al. ...................... | 257/312 |
| 2003/0127691 A1 | * | 7/2003 | Yue et al. ..................... | 257/347 |
| 2004/0129999 A1 | * | 7/2004 | Jung ........................... | 257/532 |
| 2004/0263269 A1 | * | 12/2004 | Takamatsu .............. | 331/108 C |

* cited by examiner

*Primary Examiner*—Minh-Loan T Tran
*Assistant Examiner*—W. Wendy Kuo
(74) *Attorney, Agent, or Firm*—J.C. Patents

(57) ABSTRACT

A varactor on a substrate is provided. The varactor comprises a bottom electrode, an upper electrode, a first dielectric layer and a conductive layer. The bottom electrode has several doped regions arranged in the substrate as an array with several rows and several columns, wherein the doped regions in adjacent columns are arranged alternatively. The upper electrode is located over the substrate and the upper electrode is composed of several electrode locations and has several openings, wherein each opening exposes the corresponding doped region. Furthermore, each electrode location is surrounded by three doped regions. The first dielectric layer is located between the substrate and the upper electrode. The conductive layer is located over the upper electrode, wherein the conductive layer and the upper electrode are isolated from each other and the conductive layer and the doped regions are electrically connected to each other.

12 Claims, 3 Drawing Sheets

VARACTOR

BACKGROUND OF THE INVENTION

1. Field of Invention

The present invention relates to a semiconductor structure. More particularly, the present invention relates to a varactor structure.

2. Description of Related Art

In a typical communication system, information signals, such as television program, will be tuned and placed on high frequency carrier waves to facilitate transmission of signals. Lots of information signals are transmitted simultaneously due to the properties of different frequencies having different carrier wave signals. Therefore, a receiver in a communication system is required to use a voltage controlled oscillator (VCO) to separate information signals from the carrier waves. In a VCO, a LC (inductance-capacitance) circuit comprised of the varactor and the inductance is included. The oscillation frequency of the VCO is modified by the properties of the capacitance of the varactor being modified according to the tuning of the voltage.

Commonly seen varactors include a MOS varactor with metal-oxide semiconductor transistor structure, and a Junction varactor with p-type doped regions and n-type doped regions arranged alternatively. Although the MOS varactor has a feature of a large range of tuning ((the maximum capacitance to the minimum capacitance)/the minimum capacitance), the capacitance is determined by the ratio of the upper electrode (i.e., the gate of the MOS varactor) and the sum of area of the bottom electrode between the both sides of the upper electrode in the substrate (i.e., the source area/the drain area of the MOS varactor), that is the unit capacitance is direct proportion to the ratio of the area of the upper electrode to both sides of the bottom electrode. Accordingly, how to increase the ratio of the area of the upper electrode to the sum of the area of the bottom electrode to improve the unit capacitance becomes an important issue of current development of the varactor.

SUMMARY OF THE INVENTION

The objective of the present invention is to provide a varactor, which can increase the unit capacitance and improve the quality factor of the varactor.

The present invention provides a varactor on a substrate. The varactor comprises a bottom electrode, an upper electrode, a first dielectric layer and a conductive layer. The bottom electrode has a plurality doped regions arranged in the substrate as an array with a plurality of columns and a plurality of rows, and the doped regions in the adjacent columns are arranged alternatively. The upper electrode is located over the substrate and comprised of a plurality of electrode locations. The upper electrode has a plurality of openings and each opening exposes the corresponding doped region, wherein each electrode location is directly surrounded by three doped regions. A first dielectric layer is located between the substrate and the upper electrode. The conductive layer is located over the upper electrode, wherein the conductive layer is electrically isolated from the upper electrode, and the conductive layer is electrically connected to the doped regions via the openings.

According to the varactor of the preferred embodiment of the present invention, each of the electrode locations is a polygon and the three doped regions surrounding the electrode location are located at the vertices of the polygon.

According to the varactor of the preferred embodiment of the present invention, the polygon is a regular polygon.

According to the varactor of the preferred embodiment of the present invention, the shape of each opening is quadrilateral.

According to the varactor of the preferred embodiment of the present invention, the shape of each opening is circular.

According to the varactor of the preferred embodiment of the present invention, the material of the upper electrode comprises doped polysilicon.

According to the varactor of the preferred embodiment of the present invention, a second dielectric layer is located between the upper electrode and the conductive layer, the second dielectric layer fills the openings and has a contact window, in the opening, exposing one of the doped regions at each opening.

According to the varactor of the preferred embodiment of the present invention, the ratio of the area of each electrode location to the sum of the area of the doped regions surrounded by the electrode location is equal to or greater than $\frac{1}{3}$.

The present invention further provides a varactor on a substrate. The varactor comprises a bottom electrode, an upper electrode, a first dielectric layer and a conductive layer. The bottom electrode has a plurality of doped regions arranged in the substrate. The upper electrode is located over the substrate and comprised of a plurality of electrode locations, wherein the shape of each electrode location is defined by at least five openings and each opening exposes the corresponding doped region. The first dielectric layer is located between the substrate and the upper electrode. The conductive layer is located over the substrate, wherein the conductive layer is electrically isolated from the upper electrode, and the conductive layer is electrically connected to the doped regions via the openings.

According to the varactor of the preferred embodiment of the present invention, the electrode location is a polygon and the doped regions surrounding the electrode location are at the vertices of the polygon.

According to the varactor of the preferred embodiment of the present invention, the polygon is a regular polygon.

According to the varactor of the preferred embodiment of the present invention, the shape of each opening is quadrilateral.

According to the varactor of the preferred embodiment of the present invention, the shape of each opening is circular.

According to the varactor of the preferred embodiment of the present invention, the shape of each opening is hexagonal.

According to the varactor of the preferred embodiment of the present invention, the material of the upper electrode comprises doped polysilicon.

According to the varactor of the preferred embodiment of the present invention, a second dielectric layer is located between the upper electrode and the conductive layer, the second dielectric layer fills the openings and comprises a contact window, in the opening, exposing one of the doped regions.

According to the varactor of the preferred embodiment of the present invention, the ratio of the area of each electrode location to the sum of the area of the doped regions surrounded by the electrode location is equal to or greater than $\frac{1}{3}$.

According to the varactor of the preferred embodiment of the present invention, each electrode location is surrounded by six doped regions.

According to the varactor of the preferred embodiment of the present invention, the doped regions in the substrate are arranged as an array with a plurality columns and a plurality of rows, and the doped regions in the adjacent columns are arranged alternatively.

According to the varactor of the preferred embodiment of the present invention, the electrode locations are arranged in a compact and complementary manner.

The upper electrode of the varactor of the present invention is comprised of a plurality of electrode locations, and each electrode location is surrounded by a plurality of openings, which expose the doped regions in the substrate, respectively. That is, each electrode location of the upper electrode is surrounded by a plurality of doped regions, the ratio of the area of each electrode location to the sum of the area of the doped regions surrounded by the electrode location is equal to or greater than ⅓. Accordingly, the capacitance of each electrode location and the quality factor (Q factor) of the varactor can be increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
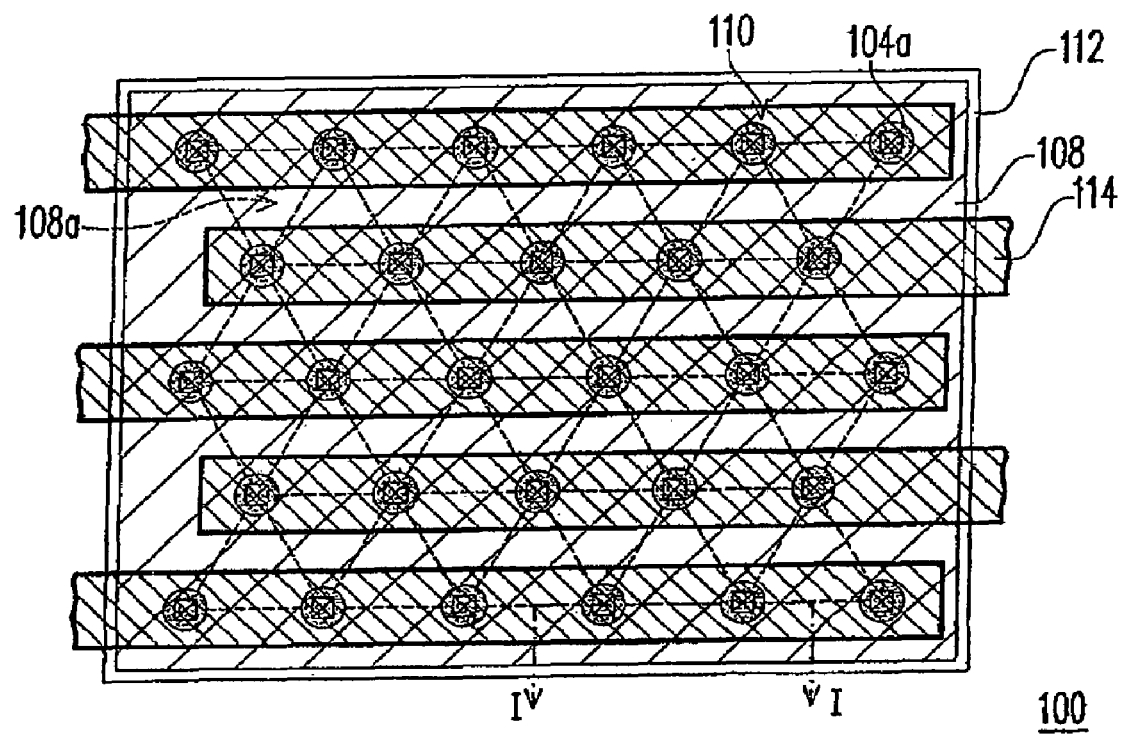
FIG. 1A is a top view of a varactor according to a preferred embodiment of the invention.
Figure 1B:
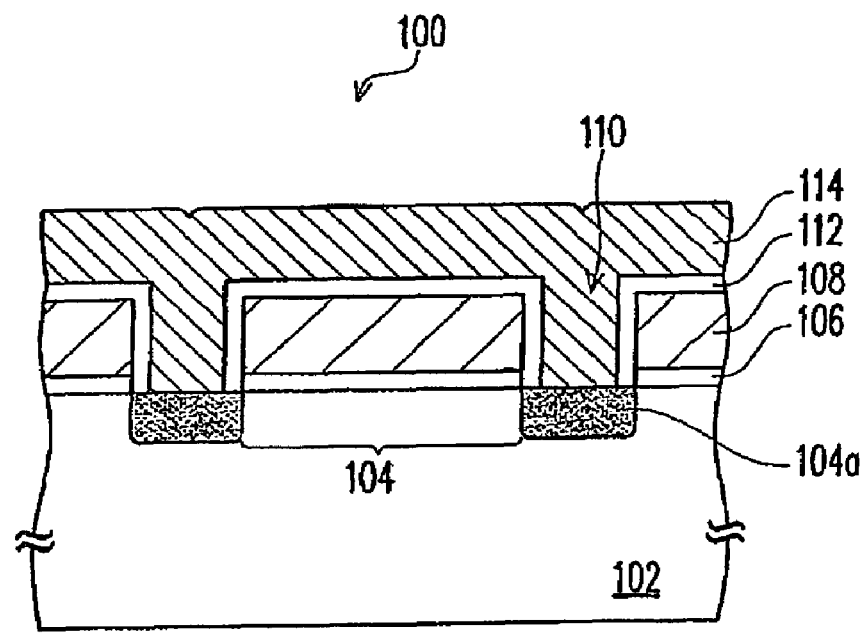
FIG. 1B is a cross-sectional view of a varactor along a line I-I in FIG. 1A.

FIG. 1A is a top view of a varactor according to a preferred embodiment of the invention. FIG. 1B is a cross-sectional view of a varactor along a line I-I in FIG. 1A. As shown in FIG. 1A together with FIG. 1B, a varactor 100 is located on a substrate 102, wherein the varactor 100 comprises a bottom electrode 104. The bottom electrode 104 has several doped regions 104a in the substrate 102. The substrate 102 can be, for example but not limited to, a semiconductor substrate formed from silicon, germanium, silicon germanium, arsenic gallium or arsenic indium. Furthermore, the substrate 102 can be, for example but not limited to, a multi-layered substrate such as a silicon-on-insulator substrate or silicon/silicon germanium. The dopants in the doped region 104a can be, for example but not limited to, P conductive type ions or N conductive type ions. Additionally, the doped region 104a in the substrate 102 can be, for example, arranged in an array with several columns and several rows and the doped regions in adjacent columns are arranged alternatively.

The varactor 100 further comprises an upper electrode 108 located over the substrate 102 and the upper electrode 108 is comprised of several electrode locations 108a. The upper electrode 108 can be, for example, made of doped polysilicon or other conductive material. Moreover, the upper electrode 108 comprises several openings 110. Each opening 110 exposes the corresponding doped region 104a. As shown in FIG. 1A and as described above, since the doped regions 104a in the substrate 102 can be arranged to be an array and the doped regions 104a in the adjacent columns are arranged alternatively, the openings 110 in the upper electrode 108 are arranged to be an array corresponding to the doped regions 104a arranged in the substrate 102 in which the openings in the adjacent columns are arranged alternatively. Furthermore, the shape of each electrode location 108a is defined by several openings. For example, each electrode location is a polygon. Preferably, each location is a regular polygon. Also, the doped regions surrounding the electrode location are located at the vertex of the polygon. Preferably, the electrode locations 108a of the upper electrode 108 are arranged in a compact and complementary manner. As shown in FIG. 1A, each electrode location 108a is defined by three doped regions 104a and the shape of the electrode location 108a is triangle. Additionally, the electrode locations 108a are arranged in a compact and complementary manner. Preferably, the shape of the electrode location 108a is regular triangle. Also, the ratio of the area of each electrode location 108a to the sum of the area of the three doped regions 104a surrounding the electrode location 108a is equal to or larger than ⅓.

It should be noticed that varactor 100 further comprises a first dielectric layer 106 located between the substrate 102 and the upper electrode 108. The first dielectric layer 106 can be, for example but not limited to, made from silicon oxide, silicon nitride or silicon oxy-nitride by chemical vapor deposition.

Moreover, a second dielectric layer is located over the upper electrode 108 and substrate 102. The second dielectric layer 112 fills in the openings 110 and has a contact window in each opening 110 expose the surface of the doped region 104a. The second dielectric layer 112 can be, for example but not limited to, formed from silicon oxide, silicon nitride or silicon oxy-nitride by deposition. Preferably, the second dielectric layer 112 can be, for example, formed by chemical vapor deposition.

Further, a conductive layer 114 is located over the upper electrode 108, and is electrically connected to the doped region 104a via the opening 110. The conductive layer 114 and the upper electrode 108 are electrically isolated from each other using the second dielectric layer 112.

In the above embodiment, the shape of each opening of the upper electrode 108 is circular, and each electrode location 108a is surrounded by three doped regions. However, in practice, the present invention is not limited by the above embodiment. The other application embodiments of the present invention are described with FIGS. 2, 3 and 4 as follows, respectively.

Figure 2:
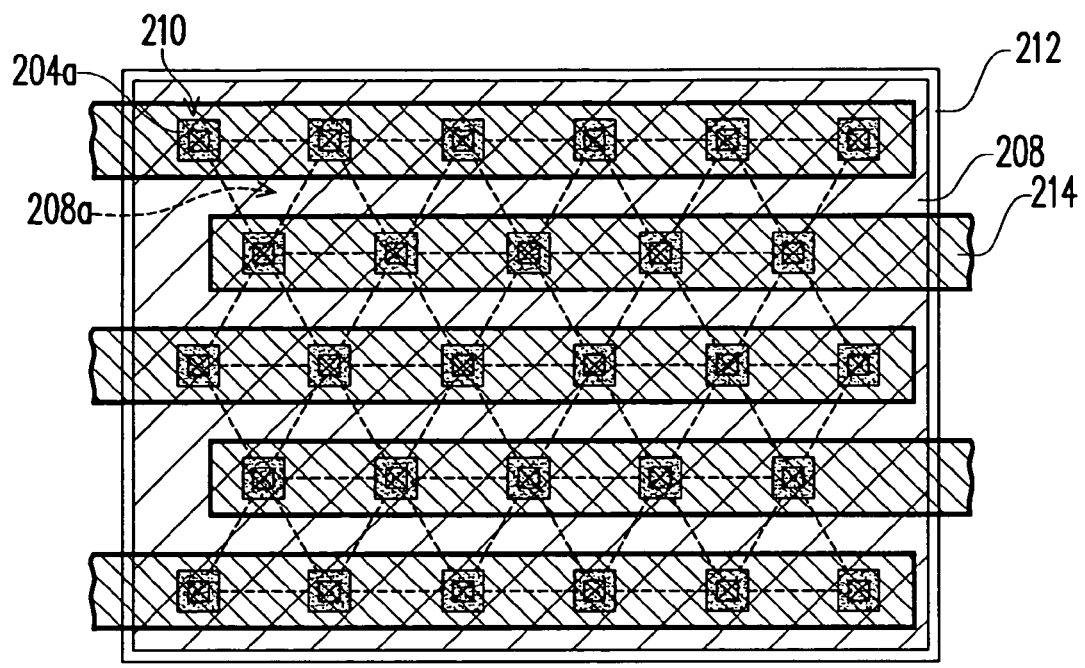
FIG. 2 is a top view of a varactor according to another preferred embodiment of the invention.

FIG. 2 is a top view of a varactor according to another preferred embodiment of the invention. As shown in FIG. 2, the difference between the varactors in FIG. 1A and FIG. 2 is that the shape of the opening 210 of the upper electrode 208 in FIG. 2 is quadrangle.

Figure 3:
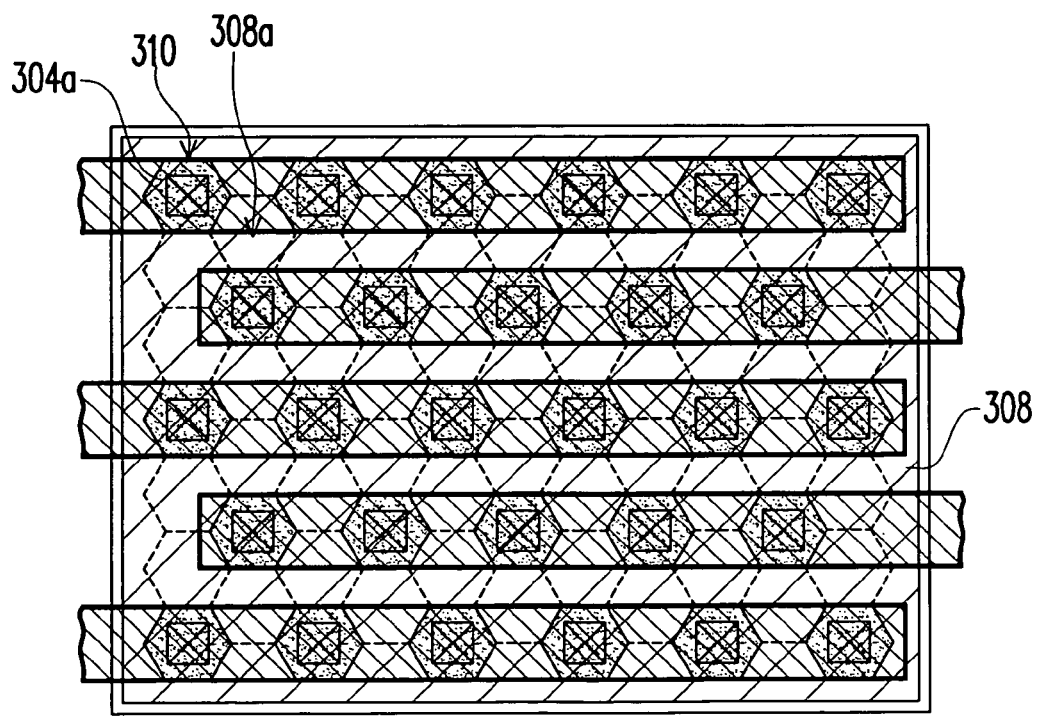
FIG. 3 is a top view of a varactor according to the other preferred embodiment of the invention.

FIG. 3 is a top view of a varactor according to the other preferred embodiment of the invention. As shown in FIG. 3, the shape of the opening 310 of the upper electrode 308 is hexagon and the shape of the electrode location 308a is hexagon as well. Further, the electrode locations 308a and the openings 310 are arranged as a honeycomb arrangement. In this embodiment, the doped regions 304a are arranged as the arrangement of the doped regions 104a in FIG. 1A and the doped regions 304a in the adjacent columns are arranged alternatively. Furthermore, the area of each electrode location 308a is about the same as the area of one of the doped regions 304a surrounding the electrode location 308a. Hence, the ratio of the area of each electrode location 308a to the sum of the area of the doped regions 304a is equal to ⅓.

Figure 4:
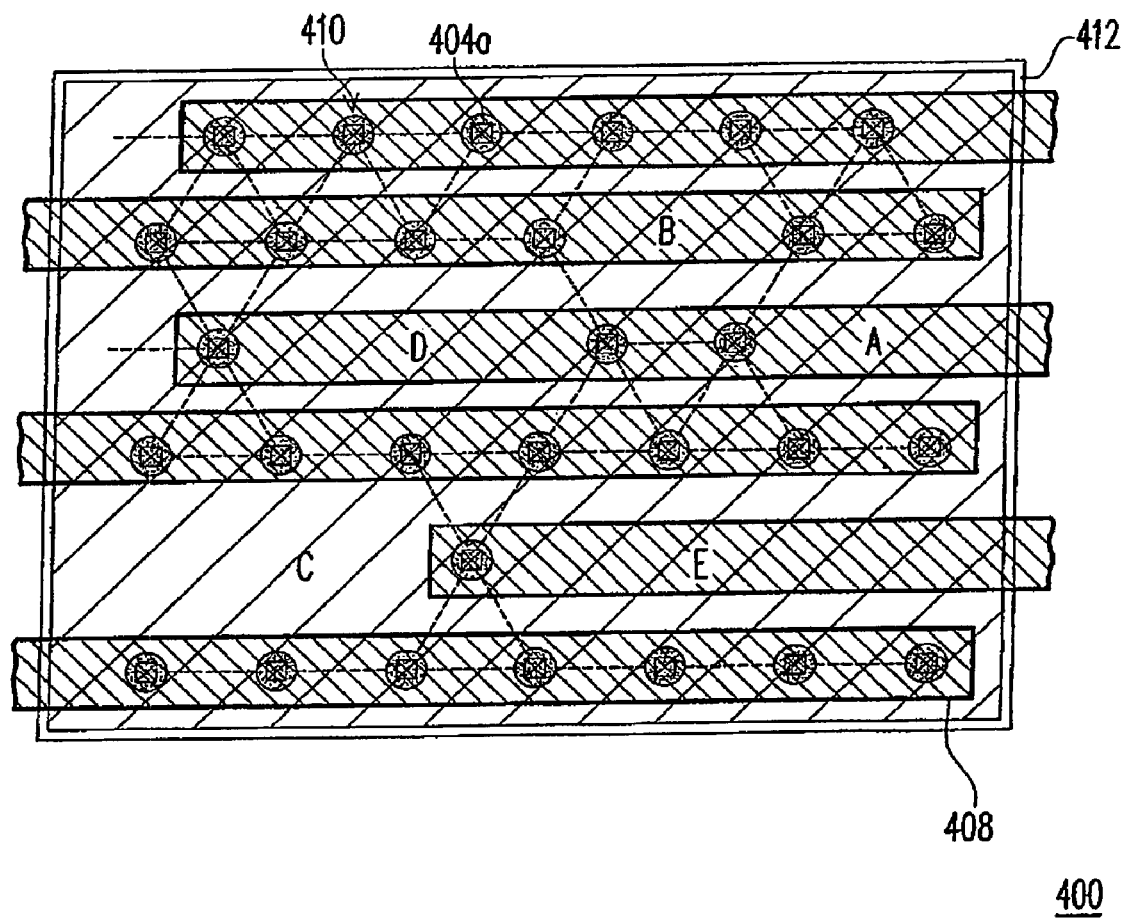
FIG. 4 is a top view of a varactor according to the other preferred embodiment of the invention.

FIG. 4 is a top view of a varactor according to the other preferred embodiment of the invention. As shown in FIG. 4, the doped region 404a is not arranged in an array. The electrode location labeled region A is located at the peripheral region of the varactor 400 and the electrode location labeled region A is surrounded by five doped regions 404a. Furthermore, the electrode location labeled region B is surrounded by six doped regions 404a. Also, the electrode location labeled region C is located at the peripheral region of the varactor 400 and the electrode location labeled region C is surrounded by seven doped regions 404a. Additionally, the electrode location labeled region D is surrounded by eight doped regions 404a. Furthermore, the electrode location labeled region E is located at the peripheral region of the varactor 400 and the electrode location labeled region E is surrounded by nine doped regions 404a. As described above, the electrode locations in FIG. 4 are arranged in a compact and complementary manner and each electrode location is surrounded by several doped regions. That is, the ratio of the area of each electrode location to the sum of the area of the doped regions surrounding the electrode location is equal to or larger than ⅓.

Altogether, the upper electrode of the varactor of the present invention is comprised of several electrode locations and each electrode location is surrounded by several openings. Theses openings expose the doped regions respectively. That is, each electrode location is surrounded by several doped regions. Therefore, the capacitance of each electrode location is improved and the quality factor of the varactor is improved as well.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A varactor on a substrate, comprising:
    a bottom electrode having a plurality of doped regions disposed in the substrate, wherein the doped regions are not arranged regularly in every column and/or row;
    an upper electrode located over the substrate and comprised of a plurality of openings and a plurality of electrode locations defined by the immediately adjacent openings, wherein each of the electrode locations is surrounded by at least three openings and each of the openings exposes one of the corresponding doped regions, and at least the number of the openings surrounding one of the electrode locations is different from that of the openings surrounding the other electrode location;
    a first dielectric layer located between the substrate and the upper electrode; and
    a plurality of conductive lines located over the upper electrode, wherein the conductive lines are parallel strips and physically separate from each other, electrically isolated from the upper electrode, and the conductive lines are electrically connected to the doped regions via the openings.

2. The varactor of claim 1, wherein each of the electrode locations is a polygon and the doped regions surrounding the electrode locations are disposed at the vertices of the polygon.

3. The varactor of claim 2, wherein the polygon is a regular polygon.

4. The varactor of claim 1, wherein the shape of each of the openings is quadrilateral.

5. The varactor of claim 1, wherein the shape of each of the openings is circular.

6. The varactor of claim 1, wherein the shape of each of the openings is hexagonal.

7. The varactor of claim 1, wherein the material of the upper electrode comprises doped polysilicon.

8. The varactor of claim 1, wherein a second dielectric layer is located between the upper electrode and the conductive layer, the second dielectric layer fills the openings and comprises a plurality of contact windows, each contact window in the opening exposing one of the doped regions.

9. The varactor of claim 1, wherein the ratio of the area of each of the electrode locations to the sum of the area of the doped regions surrounding the electrode locations is equal to or greater than ⅓.

10. The varactor of claim 1, wherein each of the electrode locations is surrounded by six doped regions.

11. The varactor of claim 1, wherein the electrode locations are arranged in a compact and complementary manner.

12. The varactor of claim 1, wherein at least two of the doped regions surrounding each electrode location are electrically and physically connected to two different conductive lines.

* * * * *